United States Patent
Moore et al.

(10) Patent No.: US 7,232,770 B2
(45) Date of Patent: Jun. 19, 2007

(54) HIGH TEMPERATURE AND CHEMICAL RESISTANT PROCESS FOR WAFER THINNING AND BACKSIDE PROCESSING

(75) Inventors: John C. Moore, Camarillo, CA (US); Alexander C Smith, Aptos, CA (US)

(73) Assignee: General Chemical Performance Products LLC, Parsippany, NJ (US)

( * ) Notice: Subject to any disclaimer, the term of this patent is extended or adjusted under 35 U.S.C. 154(b) by 62 days.

(21) Appl. No.: 10/908,230

(22) Filed: May 3, 2005

(65) Prior Publication Data
US 2006/0252231 A1 Nov. 9, 2006

(51) Int. Cl.
*H01L 21/31* (2006.01)

(52) U.S. Cl. ............ 438/758; 438/781; 438/465; 438/496

(58) Field of Classification Search ........... 438/465, 438/496, 758, 781
See application file for complete search history.

(56) References Cited

U.S. PATENT DOCUMENTS

| | | | | |
|---|---|---|---|---|
| 5,578,380 | A * | 11/1996 | Babu ............... | 428/447 |
| 6,096,483 | A * | 8/2000 | Harkness et al. ...... | 430/325 |
| 6,433,057 | B1 * | 8/2002 | Bhagwagar et al. .... | 524/403 |
| 6,649,704 | B2 * | 11/2003 | Brewer et al. ........ | 525/431 |
| 6,713,569 | B2 * | 3/2004 | Chorvath et al. ...... | 525/431 |
| 6,818,608 | B2 | 11/2004 | Moore | |
| 2005/0064209 | A1 * | 3/2005 | Haines et al. ........ | 428/447 |
| 2005/0070651 | A1 * | 3/2005 | McNulty et al. ....... | 524/404 |

OTHER PUBLICATIONS

Tomanek, Andreas, Silicones & Industry: A Compendium for Practical Use, published by Wacker-Chemie GmbH, Munich, Germany, 1990 (p. 18).

* cited by examiner

*Primary Examiner*—Thao P. Le
(74) *Attorney, Agent, or Firm*—Arthur J. Plantamura

(57) ABSTRACT

A process which uses a silicone resin to form a wafer-to-carrier bonded package that enables wafer thinning and backside processing while the cured resin exhibits high chemical and thermal resistance. The process is versatile in that the constructed wafer package allows for a wide range of chemical exposures to include dilute acid and base etchants, resist and residue strippers, electroplating chemistries, and also providing use in a range of deposition and etch processes that may exceed 300° C. The process utilizes a mixture of silicone monomers that when applied to semiconductor wafers by a spin-coat application, the result is a planarization of the front side device area, and when a subsequent thin coat is applied will facilitate bonding of the wafer-to-carrier package when heat and pressure are applied. The cured silicone bonded wafer-to-carrier package allows for wafer thinning consistent to industry objectives. Backside processing may include thermal oxide deposition, installed vias, and subsequent metallization in plating baths. Upon completion of a thinned and processed wafer, detachment occurs as described in prior art. Specialty chemical systems which completely dissolves the cured silicone and allows the wafer substrate to be easily rinsed and dried and become available for subsequent processing or final dicing and packaging.

9 Claims, 3 Drawing Sheets

Vinyl Cappled Siloxane          Free Radical

Free Radical    Silyl Hydride              Silicone Polymer

HIGH TEMPERATURE AND CHEMICAL RESISTANT PROCESS FOR WAFER THINNING AND BACKSIDE PROCESSING

This invention relates to a process that uses a silicone blend adhesive system to facilitate the processing of semiconductor wafers. More specifically, the invention relates to a process that enables wafer processing at temperatures exceeding 200° C. where the high temperature and chemically resistant silicone resin is used as a temporary bonding adhesive to mount the wafer to a carrier substrate. Once the wafer is mounted, several semiconductor processes may be carried-out to include thinning, plasma etching, stripping, and in some cases, metallization. Once complete, the cured silicone resin is dissolved and removed with the use of a special reactive solvent mixture designed specifically to react and cleave the cross-linking which occurs in cured silicone polymers.

BACKGROUND OF THE INVENTION

Consistent with the design pressures of the semiconductor industry, there is a need to reduce the ever increasing heat build-up generated from higher power circuits that are smaller and smaller. A common practice is to reduce the heat storage by device thinning and cool it through thermal dissipation. To achieve this, adhesives are used to support and maintain wafer mounting during thinning to less than about 100 microns (<100 μm), and backside processing to include resist pattering, via plasma etch, residue clean, and blanket metallization. Traditional temporary mounting adhesives are thermoplastic polymers with typical melting points below 170° C. and are unsatisfactory for certain processes such as silicon oxide thermal deposition and the curing of high temperature organic dielectrics such as polyamide.

SUMMARY OF THE INVENTION

The present invention involves a wafer fabrication process using a silicone thermoset resin which allows for several thermal and chemical intensive steps. Selective dissolution of the silicone adhesive used in wafer demount and clean is achieved by using specific reactive solvent blends as described in U.S. Pat. No. 6,818,608. The removal process occurs in an immersion bath with agitation and a special designed wafer fixture which leaves the wafer and carrier interfaces clean and free of residue.

The invention fulfills a need for a system that provides the capability to service the more advanced wafer technology requiring higher thermal exposures that use plasma etching and relatively very high polymer curing and an adhesion system that is suitable to maintain the wafer mounting at high temperatures for wafer thinning and backside processing operations and is applicable for processing both compound semiconductor and silicon substrates.

In accordance with this invention, a liquid form adhesive is provided that is applied to wafers by spin-on techniques. The adhesive coated wafers are mounted to rigid substrates and are then prepared for subsequent thinning and backside processing. The system comprises an adhesive composition comprising a blend of silicone polymers having poly vinyl siloxane and silylhydrate character, which upon curing, is resistant to high temperature and chemical deterioration. The cured silicone system enables wafer processing at temperatures exceeding 200° C. following the temporary bonding to a carrier substrate.

The process of the invention employs a high temperature and chemical resistant adhesive based upon a cured silicone resin and a special reactive solvent mixture used to dissolve and remove the resin once wafer fabrication is complete. In the process a mixture of silicone monomers is applied to semiconductor wafers, curing and bonding steps, substrate thinning and processing to temperatures exceeding 200° C., and demount and clean with a specialty chemical solution. The spin-coat application of resin is designed to planarize the surface and encapsulate the device topography. Planarization is required for uniformity during bonding (mounting) to the carrier and subsequent mechanical handling. Additionally, the cured silicone acts to protect the wafer front-side surface (i.e., device area) and support the down-force pressures and shear stresses associated with backside thinning as carried out on a grinding and polishing tool.

Following the spin-coat application of the silicone thermoset resin, curing is achieved by heating such as on a hot plate. The applied heat cross-links (cures) the thermoset adhesive to produce a uniform, smooth, chemical and thermal resistant coating. Depending upon the height extent of wafer topography, conditions of the spin-speed coating, and a need for further surface penetration or planarization, the process may be repeated to lay down a second resin layer. Once the wafer is fully planarized and cured, an additional thin layer is applied to wet the surface for mounting to the carrier. This layer remains uncured until mounting. Mounting is facilitated by bringing the wafer and carrier substrate (e.g., sapphire, silicon or other ceramic) into contact and applying heat and pressure. Once cured, the wafer exists as a mounted package and thinning may proceed.

The invention can be used with a variety of tools that operate from low to high temperature including, through via plasma etchers, metal evaporation systems (i.e., thermal oxide), and high temperature ovens exceeding 200° C. The adhesive is resistant to a wide range of aggressive chemicals used in the industry for wafer processing including photoresist strippers, substrate etchants (both acidic and alkaline), and cleaning solvents.

DETAILED DESCRIPTION OF THE INVENTION

Figure 1:
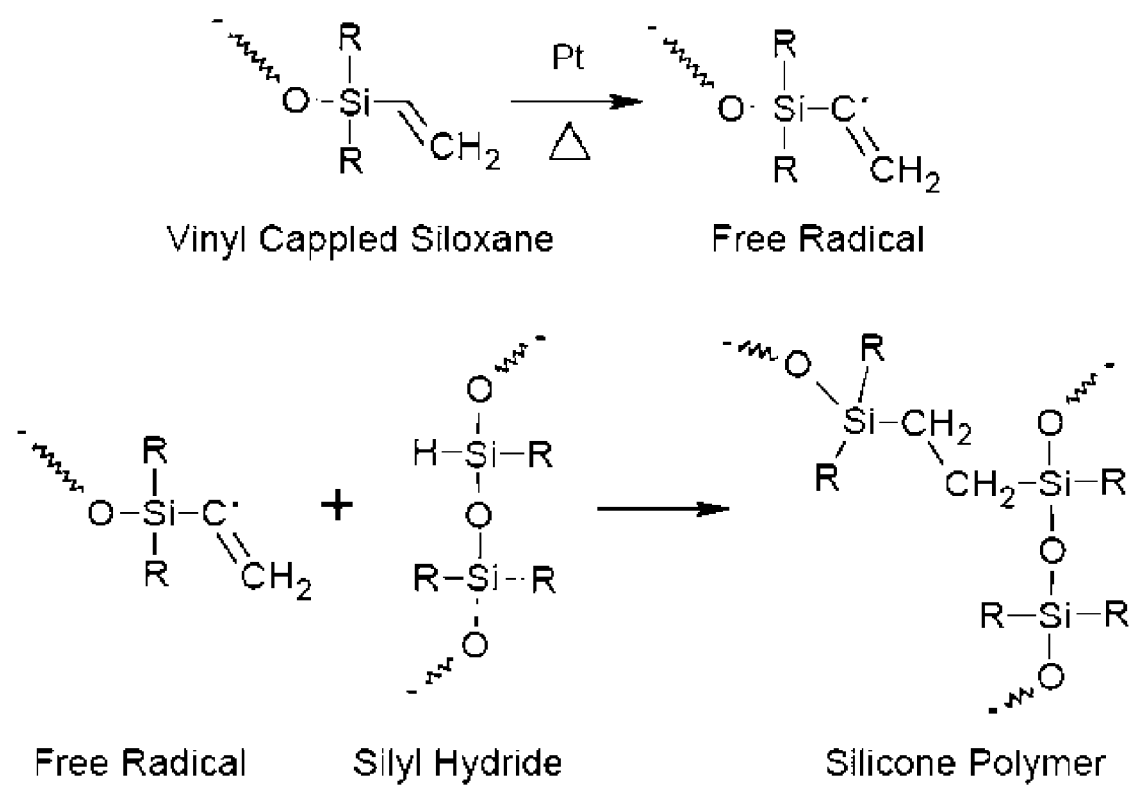
FIG. 1 illustrates the polymerization reaction of high solids silicone resin to produce a high temperature and chemical resistant coating and adhesive for wafer thinning and backside processing.

The invention utilizes a liquid form adhesive composition that is devised to be applied to semiconductor wafers by spin-on techniques, then cured, and subsequently used to mount wafers to rigid substrates. Essential to the invention is the provision of a high temperature and chemical resistant spin-on adhesive to provide high thermal resistance for subsequent thinning and backside wafer processing. The liquid adhesive is applied to the wafer front-side surface (i.e., device area) at specific conditions to achieve a defined thickness and to protect the device structures. Curing is done by thermal exposure, which cross-links the adhesive to produce a uniform, smooth, chemical and thermal resistant coating. Depending upon the wafer topography and a need for further surface penetration and planarization, the process may be repeated to lay down a second layer. Once the wafer is coated and cured, a thin layer is applied to the wafer to wet the surfaces for mounting. Mounting is facilitated by bringing the wafer and carrier substrate (e.g., sapphire, silicon, or other ceramic) into contact and applying heat and pressure. At this stage, the wafer exists as a supported substrate onto a rigid carrier, commonly referred to as the wafer package. Uniformity in the wafer package is important as thinning is commonly performed down to <100 µm, with some wafers taken to <25 µm. Once the wafer is thinned, backside processing may be performed to include the optional steps of photolithography, deposition or via etching, and metallization. Thinned and processed wafers are then removed from the carrier substrate by utilizing the dissolving compositions d as described in U.S. Pat. No. 6,818,608, the disclosure of which is incorporated herein by reference. The invention of U.S. Pat. No. 6,818,608 relates to chemical compositions that possess the capability of sufficiently dissolving a variety of cured, i.e., substantially crosslinked, difficult to dissolve polymers, such as those containing the silicon dioxide backbone, to an extent that the dissolved resin is readily rinsed away. Compositions disclosed in that patent as effective for dissolving a cured polymeric resin comprise: (a) an organo-flourine component of the formula $(CH_3CH_3CH_2CH_2)_4NF—(H_2O)_3$; (b) a soluble amine component of the formula $C_9H_{16}N_2$ or $(C_2H_5)_2NOH$; (c) a solvent for components a and b; and (d) wherein the proportion of "a" and "b" is between about 0.1 weight percent and about 15 weight percent. A summary of the process sequence steps for wafer thinning and backside processing is illustrated in Table 1.

TABLE 1

Summary Flow Chart of Wafer Thinning and Backside Processing Steps with Applications

| Process Step | Application |
| --- | --- |
| Package Mounting | Resin coat for planarization |
| | Hot plate cure |
| | Resin coat for adhesion |
| | Heat and pressure cure |
| Thinning | Grind, polish, CMP |
| | Chemical etch |
| Deposition (optional) | Oxide deposit (CVD) |
| Via Etching (optional) | Lithography |
| | Plasma RIE |
| | Residue removal |
| Metallization (optional) | Gold plating |
| Demount | Immersion silicone resin removal |

The adhesive coating blend employed in the process of the invention comprises a high solids blend of silane and siloxane monomers which contain vinyl groups and bound hydrogen atoms. As illustrated by FIG. 1, the resin system proceeds by the common organic chemical synthetic route referred to as an addition reaction, in the presence of platinum or another noble-metal catalyst. The addition is entitled a hydrosilylation reaction described by free radical polymerization process between silanes and siloxanes bearing vinyl groups and hydrogen in the presence of platinum. The catalytic reaction is triggered by the thermal release of platinum, or other noble metal, from a volatile chelating agent present in the system. In the presence of a catalyst, the vinyl compounds produce free radicals which undergo additional polymerization with silyl-hydride to produce the final product.

Commercially available silicone systems of high solids that follow a noble metal catalytic silyl-hydride process may contain various monomer types and functionalities. In this invention, silicone resin formulations were used which contain concentrations of methylated and vinyl terminated molecular chains of silane and/or siloxane. Although many formulations were tested, blends that are available from Dow Corning Corporation (under the Q1-4010 Conformal Coating Designation), were found to achieve the best results.

Figure 2:
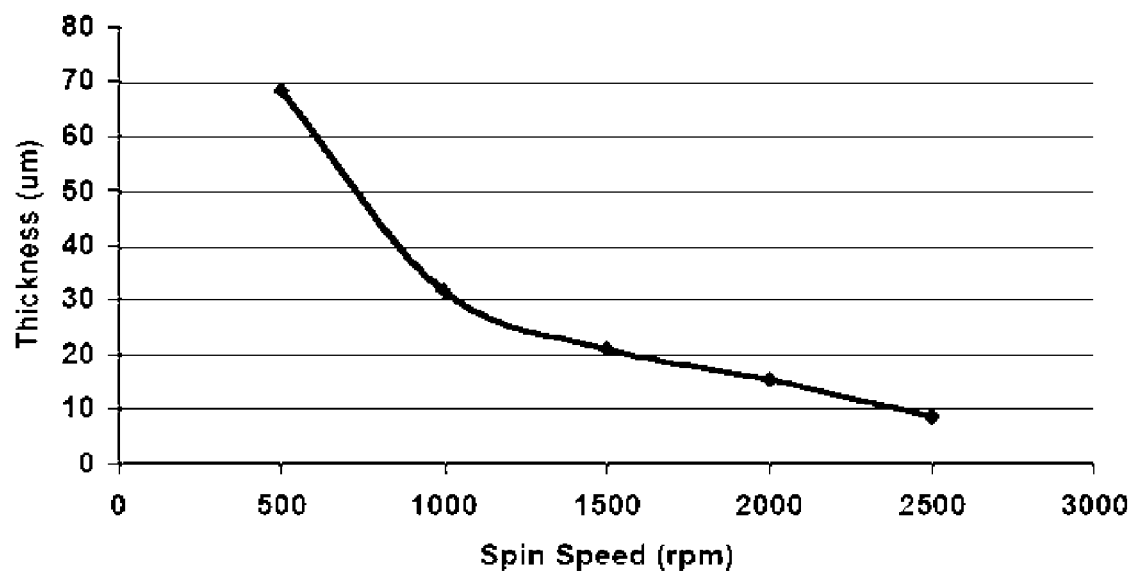
FIG. 2 shows a spin speed curve used for predicting coating thickness conditions when applying silicone polymer adhesive of >50 μm thickness onto semiconductor wafers.

The adhesive is applied directly to the wafer, much like a photoresist, using a spin-on method. A specific amount of the adhesive liquid is delivered directly to the wafer front side while staged onto the spin-coating tool. Upon delivery of the liquid adhesive, the spin tool is initiated. A vacuum chuck mechanism, which holds onto the wafer, begins to spin. As the wafer spins, centrifugal forces are applied to the resin and force the material to the outer edge, and upon reaching that point, excess material is propelled from the wafer edge and impacts the equipment bowl where it is collected and sent to a waste receptacle. The fluid that remains on the wafer undergoes a "fixing" process through solvent evaporation or material stiction, leaving the polymer condensed to a film. This silicone resin of the present invention goes on clear and evenly, achieving a potential thickness of >50 µm and meeting the desired variation control. The result is a smooth coating of a defined thickness over the entire wafer surface. Although volume delivery will affect coating thickness, the greatest impact is spin speed, measured as rotations per minute (rpm). The final coating thickness in microns can be tailored to specific process needs through changes in dispensed amounts and spin speed in rpm (see FIG. 2).

Although single coat applications are possible, two are recommended to ensure that both planarizing and mounting are achieved. The first is applied as a static puddle to the wafer and coated at the speed corresponding to the desired thickness (see FIG. 2), using a good solvent as a compatible edge bead remover (EBR) as methylethylketone (MEK) or n-butylacetate (NBA). It is then hard bake cured to 150° C.-200° C. and cooled. The second coat is applied dynamically and then spun at a higher speed to attain a thin coat. This is then taken to a soft bake (i.e., approximately 80° C.-110° C.), followed by a hard bake and mounting with pressure to a perforated sapphire in a vacuum oven. In observing the mounted wafer (wafer package), one expects a very smooth bondline without voids and slight penetration into the carrier perforations. The wafer package is now ready for thinning.

Clean-up of uncured silicone resin from tooling (i.e., coater, dispense, etc.) may be done with a variety of solvents to include MEK and NBA. Those experienced with handling of silicone resin recognize that dedicated equipment and tools are recommended. Cross-contamination of silicone is extremely difficult to remove from a process. Therefore, the coater and hotplate should be reserved for running only silicone resin unless a complete clean-out with MEK and/or NBA has been accomplished.

Substrate removal (i.e., wafer thinning) may include grinding or polishing, sometimes using a process using chemicals, referred to as chemical mechanical polishing. Depending upon the method of choice, a follow-up chemical etch is performed to relieve internal stress build-up as a result of the thinning process. The chemical etch is used for a period of time <15 min. and commonly at room temperature. Chemistries used may vary in pH and activity to include dilute blends of $H_2SO_4$ with $H_2O_2$, HCl, bleach, and HF blends. With the exception of certain concentrated acids (e.g., concentrated $H_2SO_4$), the silicone resin used in this invention is observed to have no deleterious effects. Chemical resistance of the cured resin in the wafer package provides a barrier to device attack. This eliminates the need for tape or other protective measures of covering over the carrier perforations and bond line.

Backside processing may include several process routes depending upon the substrate and device in question. Common paths for backside processing include metal or oxide deposition through chemical vapor deposition (CVD) used for thicker films, or plasma etching of vias (through holes) continuous to the front side. Oxide deposition by CVD is a common practice in the silicon wafer industry. CVD involves the heating to high temperatures of a pure specimen and introducing certain gases to change the chemical make up of the deposited film. Due to the high temperature of the source, the target (wafer) may also reach very high temperatures. For CVD processing of thermal oxide ($SiO_x$), wafer temperatures have been known to reach >300° C. It is important for the integrity of the resin within the wafer package to maintain its form, not degrade, and minimize out gassing of volatiles.

The etching of via-holes and subsequent blanket metallization is common for the compound semiconductor industry (GaAs). Patterning is completed through a normal lithography process using photoresist and an aqueous alkaline developer. The silicone resin of the invention is resistant to common lithography and development steps used for positive-tone photoresists. Etching is carried out at elevated temperature in a vacuum chamber using a reactive ion etch (RIE) plasma and a range of chemistries that combine the reactive species of the gases, e.g., $BF_3/BCl_3$ (boron tri-fluoride/boron tri-chloride) with an ultra-low pressure environment. As the RIE plasma chemistry selectively reacts to the wafer substrate areas exposed in the lithography, the nature of the continuous vacuum causes the reacted species to be evacuated from the chamber. This process continues on the opened substrate areas to a level until the via-holes are made all the way through the thinned wafer to a contact metal present on the front side, normally referred to as the etch stop. Once etching is complete, the resist mask and etch residue is removed by a cleaning process followed by an electrolytic metallization step of gold. The cured silicone resin used in the wafer package is also resistant to the chemical residue stripper and to the alkaline electrolytic gold bath.

Figure 3:
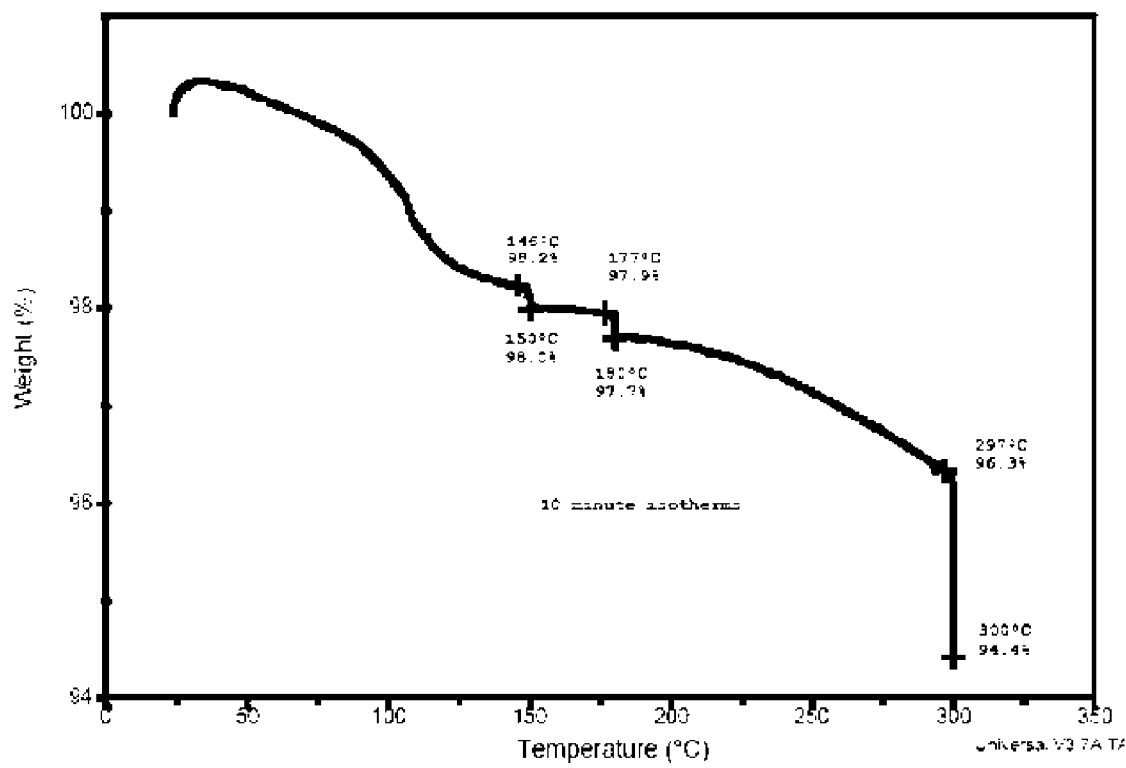
FIG. 3 is a TGA curve showing silicone adhesive weight loss during the curing reaction with loss being measured from 200° C. being near 0.5% at 250° C. and near 1% at 300° C.
Figure 3:
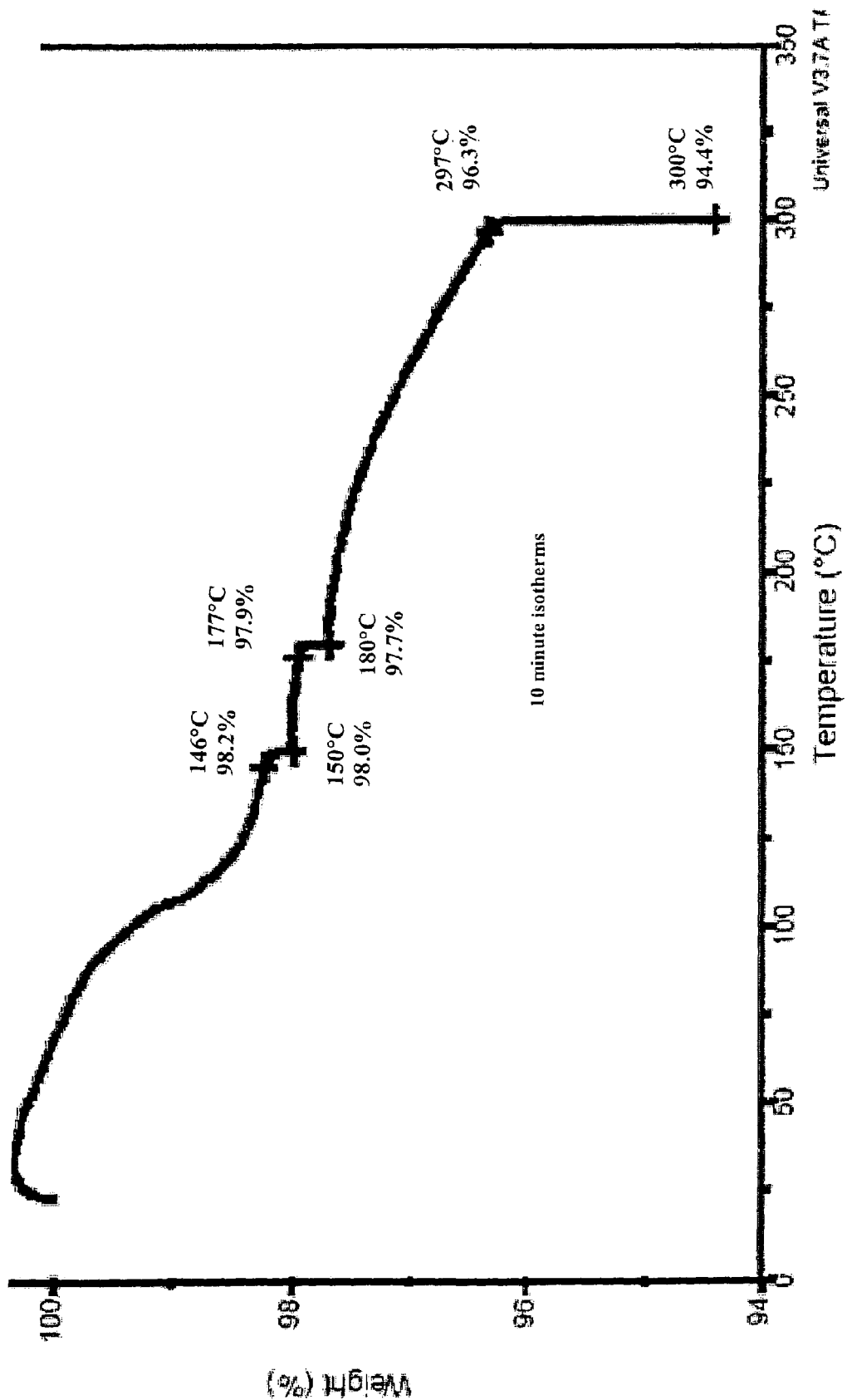

The RIE is a selective means to etch anisotropically (straight walls) down into the substrate and is very sensitive to changes in plasma chemistry. Similar to RIE, the CVD process is also sensitive to foreign material in the reaction chamber. Foreign species that outgas (evaporate) from the substrate lithography (photoresist) or the wafer package (resin) can affect etching and deposition performance and cause process failure. The resin used in this invention has been tested to produce very low outgas character, even to high temperatures. When cured at the recommended conditions, the resin of the invention is compatible up to 250° C. with measured out gassing (volatilization) to below 0.5% by weight as measured by thermogravimetry (TGA) (see FIG. 3).

This invention describes a process that uses a chemical and thermal resistant cured silicone resin. The physical and chemical resistance is a key characteristic of the silicone resin and provides for the main success of the process. The information in Table 2 is a summary for the process and the resistant character of the resin.

TABLE 2

Process Summary of Physical and Chemical Resistance of the Silicone Resin of the Invention in Wafer Thinning and Backside Processing.

| Process Step | Chemical Resistance | Physical Resistance |
| --- | --- | --- |
| Thinning | N/A | Shear stress |
| Chemical Etch | Dilute acid and base | N/A |
| CVD Oxide (optional) | N/A | High temp > 300° C. |
| Lithography (optional) | Photoresist & developer | Cure temp > 100° C. |
| RIE Vias (optional) | Plasma chemistry | Plasma temp > 100° C. |
| Mask & Via Cleans (optional) | Solvent strippers | N/A |
| Metallization (optional) | Alkaline gold bath | N/A |

The thinned and backside processed wafer is then prepared for demounting (detachment) from the carrier substrate. This process is carried-out in a chemical bath which has a high selectivity towards the silicone resin with limited compromise to the wafer or the metallic devices present on the front side. Penetration and dissolution may occur in several chemistries to include those identified as potential solvents for the invention. The process is commonly conducted at elevated temperatures and may use measures of agitation such as ultrasonic equipment. Once the wafer is demounted, it is rinsed, dried and observed to be in a pristine and clean state. At this point, the wafer is considered as a completed thinned and backside processed substrate and in a state ready for final handling in a dicing operation where the integrated circuits (ICs) are sent to final packaging onto a printed wire board (PWB) or other electronic use.

Although the invention has been described in terms of particular embodiments, blends of one or more of the various additives described, it will be apparent to those skilled in the art that well known substitutes may be employed. Accordingly, the invention is not meant to be limited to the details described herein, except as may be required by the scope of the appended claims.

What is claimed is:

1. A method for thinning and backside processing of semiconductor wafers comprising forming a wafer-to-carrier package from a chemical and thermal resistant bond that is based upon spin-coating a silicone resin comprising a high solids blend of silane and siloxane vinyl and hydride monomers and curing such silicone resin by noble metal catalytic polymerization.

2. The method of claim 1 wherein the resin is applied by a spin-coating process at thicknesses that exceed fifty (50) microns (μm).

3. The method of claim 1 wherein the spin-coated resin is cross-linked (cured) by catalytic or similar polymerization pathways to a thermoset polymer.

4. The method of claim 1 wherein the cured silicone bonded wafer-to-carrier package exhibits chemical resistance to chemicals that are commonly used for wafer thinning and backside processing including dilute acid and base etchants, developers, resist and residue removers.

5. The method of claim 1 wherein the cured silicone bonded wafer-to-carrier package exhibits thermal resistance to temperatures commonly observed in semiconductor chemical vapor deposition processes and reactive ion etch plasma processes at temperatures greater than 300° C.

6. The method of claim 1 wherein the cured silicone bonded wafer-to-carrier package is detached and demounted by dissolving away the cured adhesive using a dissolving composition comprising:

a. an organo-flourine component of the formula

$(CH_3CH_3CH_2CH_2)_4NF—(H_2O)_3$;

b. a soluble amine component of the formula $C_9H_{16}N_2$ or $(C_2H_5)_2NOH$; and c. a solvent for components a and b; and wherein the proportion of "a" and "b" is between about 0.1 weight percent and about 15 weight percent.

7. The method of claim 3 wherein the first resin coat is cured to planarize the front side wafer topography.

8. The method of claim 3 wherein the second resin coat is applied as a thin layer and used to adhere the wafer-to-carrier package with heat and pressure.

9. The method of claim 3 wherein the cured resin when exposed to temperatures between 200° C.-250° C. exhibits weight loss (outgas) values of less than 0.5%.

* * * * *